(12) United States Patent
Glenn et al.

(10) Patent No.: US 6,404,046 B1
(45) Date of Patent: Jun. 11, 2002

(54) MODULE OF STACKED INTEGRATED CIRCUIT PACKAGES INCLUDING AN INTERPOSER

(75) Inventors: Thomas P. Glenn, Gilbert; Steven M. Anderson, Chandler, both of AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/497,377

(22) Filed: Feb. 3, 2000

(51) Int. Cl.[7] .......................... H01L 23/02; H01L 23/48; H01L 23/04; H01L 23/053
(52) U.S. Cl. ...................... 257/690; 257/678; 257/698; 257/700
(58) Field of Search ................................ 257/686, 698, 257/700, 678, 685, 699, 690

(56) References Cited

U.S. PATENT DOCUMENTS

| | | | |
|---|---|---|---|
| 3,838,984 A | 10/1974 | Crane et al. | 37/83 |
| 4,398,235 A | 8/1983 | Lutz et al. | 361/393 |
| 4,833,568 A | 5/1989 | Berhold | 361/383 |
| 4,996,587 A | 2/1991 | Hinrichsmeyer et al. | 357/74 |
| 5,258,094 A | 11/1993 | Furui et al. | 156/634 |
| 5,332,864 A | 7/1994 | Liang et al. | 174/52.4 |
| 5,381,047 A | 1/1995 | Kanno | 257/777 |
| 5,394,010 A | 2/1995 | Tazawa et al. | 257/686 |
| 5,435,057 A | 7/1995 | Bindra et al. | 29/830 |
| 5,455,385 A | 10/1995 | Hoffman et al. | 174/52.4 |
| 5,587,341 A | 12/1996 | Masayuki et al. | 437/206 |
| 5,594,275 A * | 1/1997 | Kwon et al. | 257/686 |
| 5,625,221 A * | 4/1997 | Kim et al. | 257/686 |
| 5,677,569 A * | 10/1997 | Choi et al. | 257/686 |
| 5,715,147 A | 2/1998 | Nagano | 361/813 |
| 5,835,988 A * | 11/1998 | Ishii | 257/684 |

(List continued on next page.)

FOREIGN PATENT DOCUMENTS

| | | | | |
|---|---|---|---|---|
| EP | 0 948 048 A1 | 10/1999 | ......... | H01L/23/495 |
| JP | 64-54749 | 3/1989 | | |
| JP | 406188333 A | * 7/1994 | | |
| JP | 406188354 A | * 7/1994 | | |
| JP | 406204371 A | * 7/1994 | | |
| JP | 406209062 A | * 7/1994 | | |
| JP | 406216277 A | * 8/1994 | | |
| JP | 406216296 A | * 8/1994 | | |
| JP | 406216313 A | * 8/1994 | | |
| JP | 7-312405 | 11/1995 | | |
| JP | 8-125066 | 5/1996 | | |
| JP | 8-306853 | 11/1996 | | |
| JP | 9-8205 | 1/1997 | | |
| JP | 9-8206 | 1/1997 | | |
| JP | 9-8207 | 1/1997 | | |
| JP | 9-92775 | 4/1997 | | |
| WO | WO 99/65282 | 12/1999 | ........... | H01L/23/12 |

*Primary Examiner*—Matthew Smith
*Assistant Examiner*—Chuong A. Luu
(74) *Attorney, Agent, or Firm*—Skjerven Morrill LLP; James E. Parsons

(57) ABSTRACT

A module of electrically interconnected integrated circuit packages and methods of making the module are disclosed. The module includes at least first and second integrated circuit packages, each of which are comprised of a package body formed of an encapsulant material. A plurality of leads extend from the package bodies of the first and second packages. The leads are bent into a C-shape. Keys and keyholes in the package bodies allow the packages to be stacked one on top of the other. One or more leads of the first package are electrically connected to one or more leads of the second package through an interposer that is positioned between the first and second packages. The interposer includes conductive paths that enable the electrical connection of leads of the first and second packages in cases where the leads to be interconnected are displaced from one and other.

30 Claims, 4 Drawing Sheets

U.S. PATENT DOCUMENTS

| | | | |
|---|---|---|---|
| 5,859,471 A | | 1/1999 | Kuraishi et al. ............. 257/666 |
| 5,877,043 A | | 3/1999 | Alcoe et al. ................. 438/123 |
| 5,880,403 A | * | 3/1999 | Czajkowski et al. ...... 174/35 R |
| 5,901,050 A | * | 5/1999 | Imai ........................... 361/820 |
| 5,986,209 A | | 11/1999 | Tandy ........................ 174/52.4 |
| 6,036,173 A | * | 3/2000 | Neu et al. .................... 257/668 |
| 6,060,768 A | * | 5/2000 | Hayashida et al. .......... 257/666 |
| 6,075,712 A | * | 6/2000 | McMahon ................... 361/783 |
| 6,087,715 A | * | 7/2000 | Sawada et al. ............. 257/666 |
| 6,114,221 A | | 9/2000 | Tonti et al. .................. 438/455 |
| 6,175,149 B1 | * | 1/2001 | Akram ........................ 257/676 |
| 6,339,255 B1 | * | 1/2001 | Shin ............................ 257/686 |
| 6,208,021 B1 | * | 3/2001 | Ohuchi et al. ............... 257/690 |
| 6,236,109 B1 | * | 5/2001 | Hsuan et al. ................ 257/688 |
| 6,285,080 B1 | * | 9/2001 | Bezama et al. .............. 257/738 |
| 6,297,964 B1 | * | 10/2001 | Hashimoto ................... 361/760 |
| 6,300,685 B1 | * | 10/2001 | Hasegawa et al. .......... 257/780 |
| 6,310,390 B1 | * | 10/2001 | Moden ........................ 257/668 |

* cited by examiner

MODULE OF STACKED INTEGRATED CIRCUIT PACKAGES INCLUDING AN INTERPOSER

CROSS REFERENCE TO RELATED APPLICATION

This application is related to a pending, commonly-assigned U.S. patent application entitled "Stackable Package for an Integrated Circuit," which has been assigned Ser. No. 09/484,192, was filed on Jan. 18, 2000, and is incorporated herein by reference in its entirety.

BACKGROUND OF THE INVENTION

1. Field of the Invention

The present application concerns packaging for one or more integrated circuits, and in particular concerns a package that easily can be electrically interconnected with other packages using an interposer.

2. Description of Related Art

In the field of integrated circuit packaging, it is known to include a plurality of integrated circuits in a single package body. Bond pads of each integrated circuit are electrically connected by bond wires to leads of the package. The leads subsequently are electrically connected to metallizations on a printed circuit board. Providing a plurality of integrated circuits in one package allows an increase in package density without a significant increase in the area of the printed circuit board that is consumed by the package.

A problem with conventional packages, even packages that contain a plurality of integrated circuits, is that further increases in density per unit area of the printed circuit board are not easily attainable. So, for example, if a package includes two sixteen megabit memory integrated circuits (total thirty-two megabits), then increasing the total amount of memory to 128 megabits would require three additional packages, each of which would require additional mounting area on the printed circuit board.

SUMMARY OF THE INVENTION

The present invention allows control over the amount of area of a printed circuit board at is consumed by integrated circuit packages. It also provides easy means for electrically connecting packages to one another.

One embodiment of the present invention includes integrated circuit packages that can be stacked one on top of the other so as to form a module of electrically interconnected packages. The electrical interconnections between the stacked packages are determined by an interconnection member, viz. interposer, that is positioned between the lower and upper packages. The interconnection member comprises an insulative film with metallization layers on both of its opposing major surfaces, and metallized vias that electrically connect particular metallizations of the opposing surfaces. The metallizations on one major surface of the insulative film are electrically connected to the leads of the lower package, and the metallizations on the other major surface of the insulative film are electrically connected to the leads of the upper package. Accordingly, the interconnection member allows leads of the lower package to be electrically connected to distally located leads of the upper package, and vice versa. By using such an interposer, packages that have different lead configurations can be stacked and electrically interconnected. For example, a memory integrated circuit package may be stacked on a microprocessor integrated circuit package These and other aspects of the present invention are presented in greater detail below and in the accompanying figures.

BRIEF DESCRIPTION OF DRAWINGS

In the drawings, features of the various embodiments that are similar are usually referred to using the same numbers.

DETAILED DESCRIPTION OF EXEMPLARY EMBODIMENTS

The present invention is related to inventions disclosed in a pending, commonly-assigned U.S. patent application entitled "Stackable Package for an Integrated Circuit," which has been assigned Ser. No. 09/484,192, and is incorporated herein by reference in its entirety.

Figure 1:
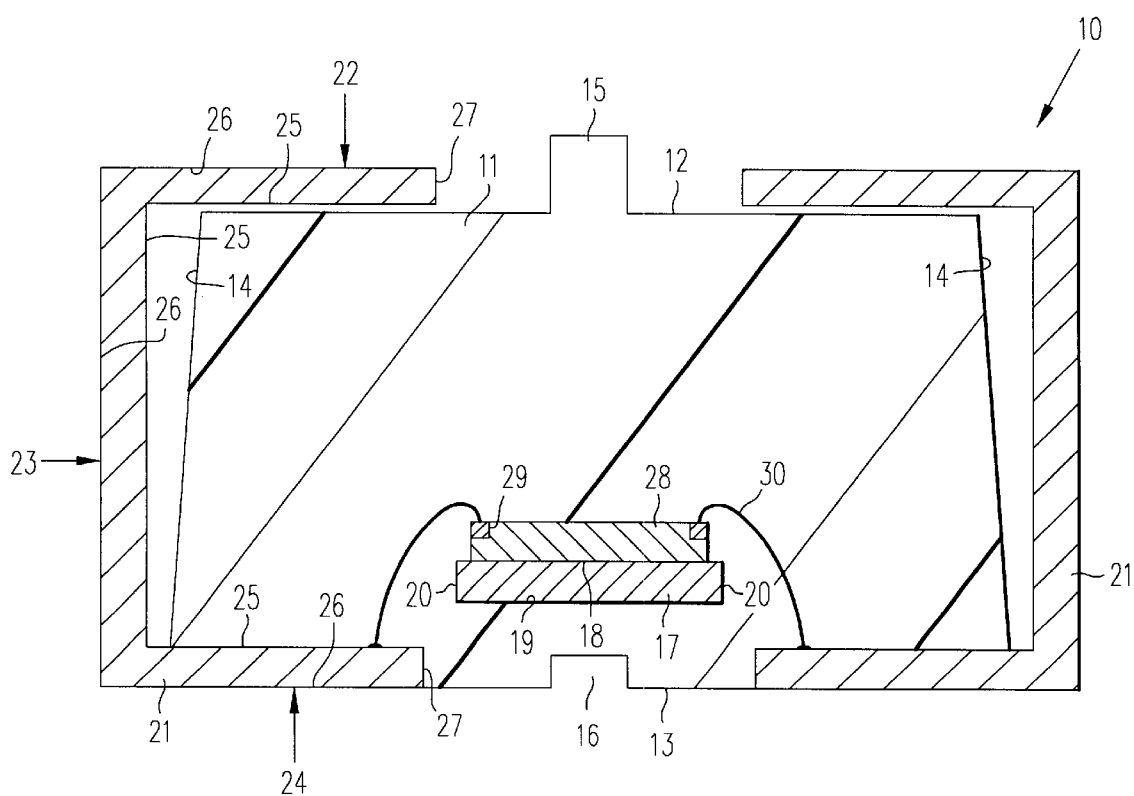
FIG. 1 is cross-sectional side view of a stackable package 10.

FIG. 1 is a cross-sectional side view of a stackable package 10. Package 10 includes a package body 11 formed of a conventional molded, insulative encapsulant material, such as an epoxy resin. Package 10 includes a largely planar upper first surface 12, an opposite largely planar lower second surface 13, and tapered peripheral side surfaces 15 that extend vertically between first surface 12 and second surface 13.

Figure 2:
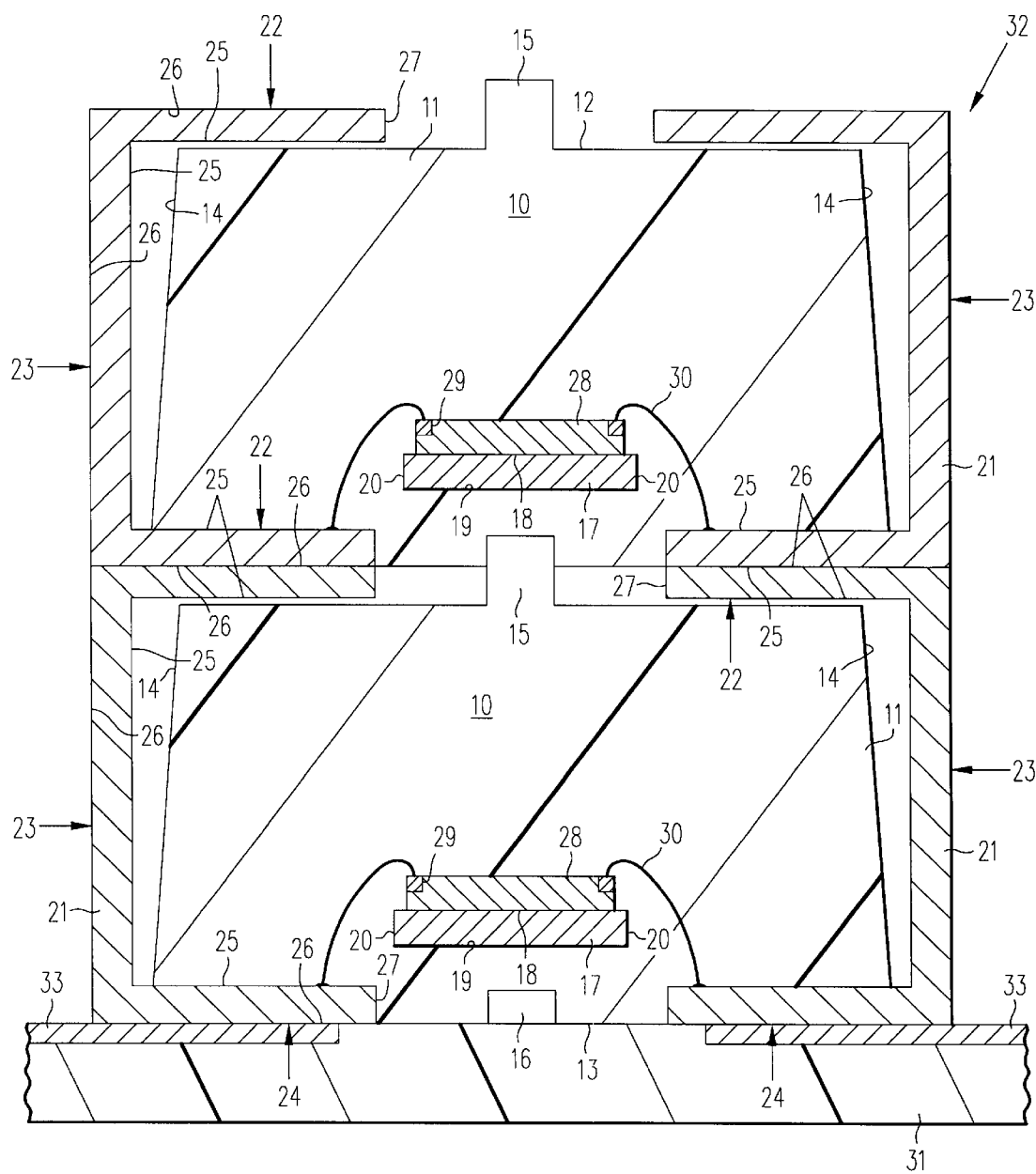
FIG. 2 is a cross-sectional side view of a stack 32 of two packages 10.

Referring to FIG. 1, two protruding keys 15 formed of encapsulant material extend from first surface 12 of package body 11. (Only one key 15 is visible in this cross sectional view.) Second surface 13 of package body 11 includes two keyholes 16. (Only one keyhole 16 is visible in this cross sectional view.) Keys 15 are formed so as to engage with a keyhole 16 of another package that is to be stacked on first surface 12, as is shown in FIG. 2. The engagement of keys 15 into respective keyholes 16 of another package stacked thereon assures that the packages can only be stacked in one way. This avoids possible alignment and electrical interconnection errors during the assembly of a stack of packages. The number, shape and location of keys 15 and keyholes 16 of package 10 can vary according to the available room on first surface 12 and second surface 13 of package body 11.

Package 10 includes a rectangular planar metal die pad 17. Die pad 17 includes a planar first surface 18, an opposite planar second surface 19, and side surfaces 20 extending between first surface 18 and second surface 19. Die pad 17 is up set within package body 11 so that encapsulant material covers second surface 19 of die pad 17. Keyhole 16 is adjacent to second surface 19 of die pad 17.

Package 10 also includes a plurality of metal leads 21. Leads 21 may extend from two opposing sides 14 of package 10, as in a dual package, or may extend from all four sides of package 10, as in a quad package. For purposes of example, assume that package 10 has leads on two sides 14 of package 10, and thus is a dual package. The number of leads 21 will vary with the application.

Leads 21 include two approximately 90° bends so as to have a C-shape. A horizontal first portion 22 of each lead 21 is just above or on first surface 12 of package 10. A second portion 23 of each lead 21 extends vertically adjacent to side surface 14 of package 10. Finally, a horizontal third portion 24 of each lead 21 is embedded at second surface 13 of package body 11. Before being bent into a C shape, each lead 21 is planar. Hence, each first portion 22, second portion 23, and third portion 24 of each lead 21 has a planar inner first surface 25, an opposite planar outer second surface 26, and side surfaces 27 extending between first surface 25 and second surface 26.

In package 10, die pad 17 is entirely within package body 11. Most of third portion 23 of each lead 21 also is within package body 11. In particular, encapsulant covers first surface 25 and side surface 27 of third portion 24 of each lead 21. Second surface 26 of third portion 24 of each lead 21 is not covered by encapsulant, but rather is exposed at lower second surface 13 of package body 11. Accordingly, third portion 24 of leads 21 may be electrically interconnected to an underlying printed circuit board or another package. In an alternative embodiment (not shown), die pad 17 is not up set into package body 11, but rather is in the same horizontal plane as third portion 24 of leads 21 such that second surface 19 of die pad 17 is exposed at second surface 13 of package body 11. A lead 21 may be removed to make room for keys 15 and keyholes 16.

FIG. 2 shows a module of two packages 10 mounted one on top of the other on a printed circuit board 31, thus forming a stack 32 of two electrically interconnected packages 10. Leads 21 of the lower package 10 are electrically connected to metal traces 33 on printed circuit board 31 using solder. The solder is electrically connected between traces 33 and the exposed second surfaces 26 of third portions 24 of leads 21 of package 10. The upper package 10 is stacked on the lower package 10 so that keys 15 of the lower package 10 are each in a keyhole 16 of the upper package 10. Leads 21 of the lower package 10 abut mirror-image leads 21 of the upper package 10, thus forming an electrical interconnection. Solder is electrically connected between the second surface 26 of the first portion 22 of each lead 21 of the lower package 10 and the abutting second surface 26 of the third portion 24 of the corresponding lead 21 of the upper package 10.

Figure 3:
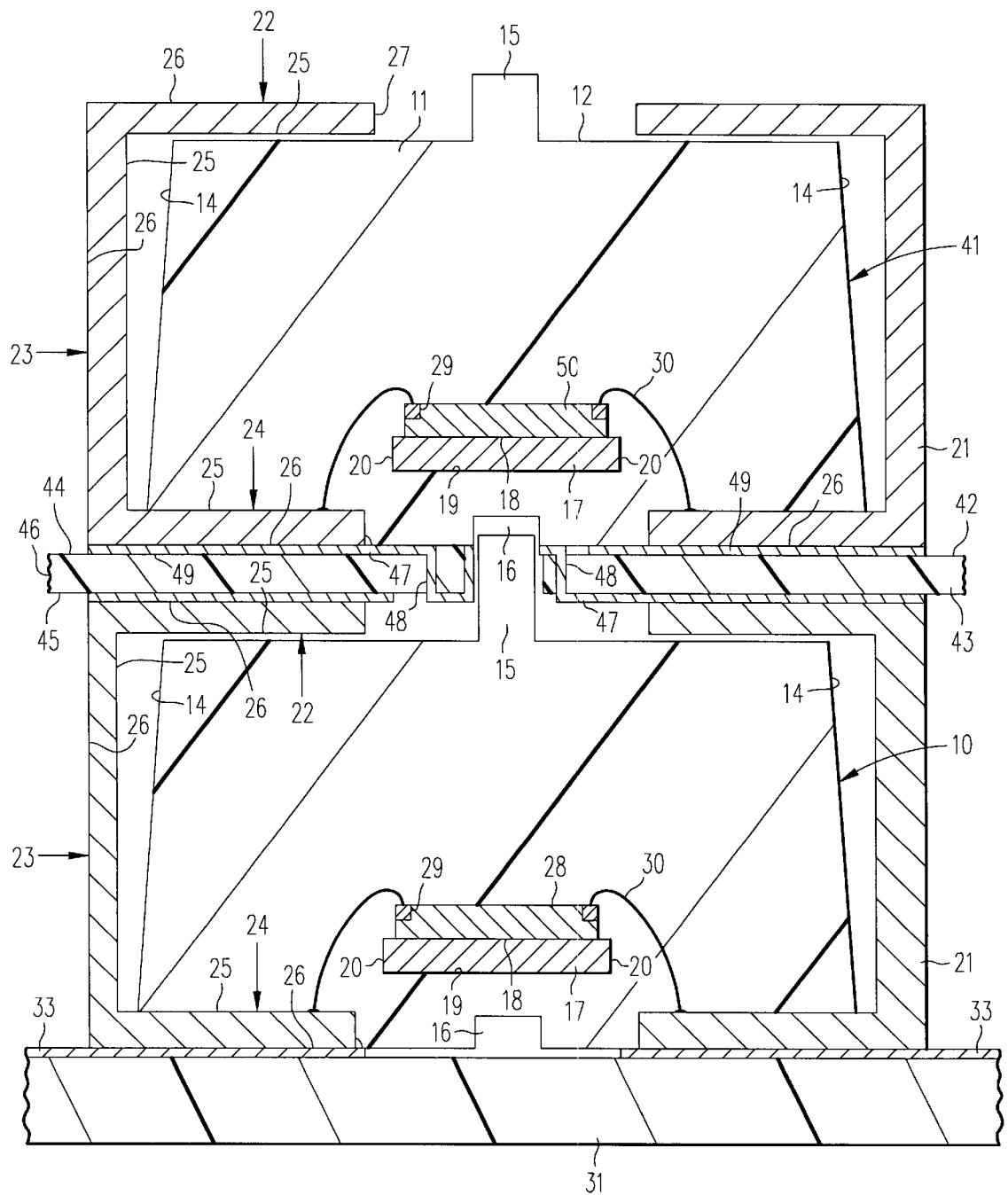
FIG. 3 is cross-sectional side view of a stack 40 comprised of a package 10 and a package 41.

FIG. 3 is a cross-sectional view of an embodiment, within the present invention, of a stack 40 including a lower package 10 (described above) and an upper package 41. Externally, package 41 is similar to package 10, e.g., both have C-shaped leads 21, keys 15, keyholes 16, and package bodies 11. An internal difference is that package 41 includes a different integrated circuit than package 10. In particular, package 41 includes an integrated circuit 50, rather than an integrated circuit 28. For example, package 10 may include a microprocessor, and package 41 may include a memory integrated circuit.

Assume that some or all of leads 21 of package 10 are not to be electrically connected to the mirror-image leads of package 41, but rather are to be electrically connected to distally located leads of package 10. To facilitate the electrical interconnection of packages 10 and 41, stack 40 includes an interconnection member, interposer 42, which is located vertically between package 10 and package 41.

Figure 4:
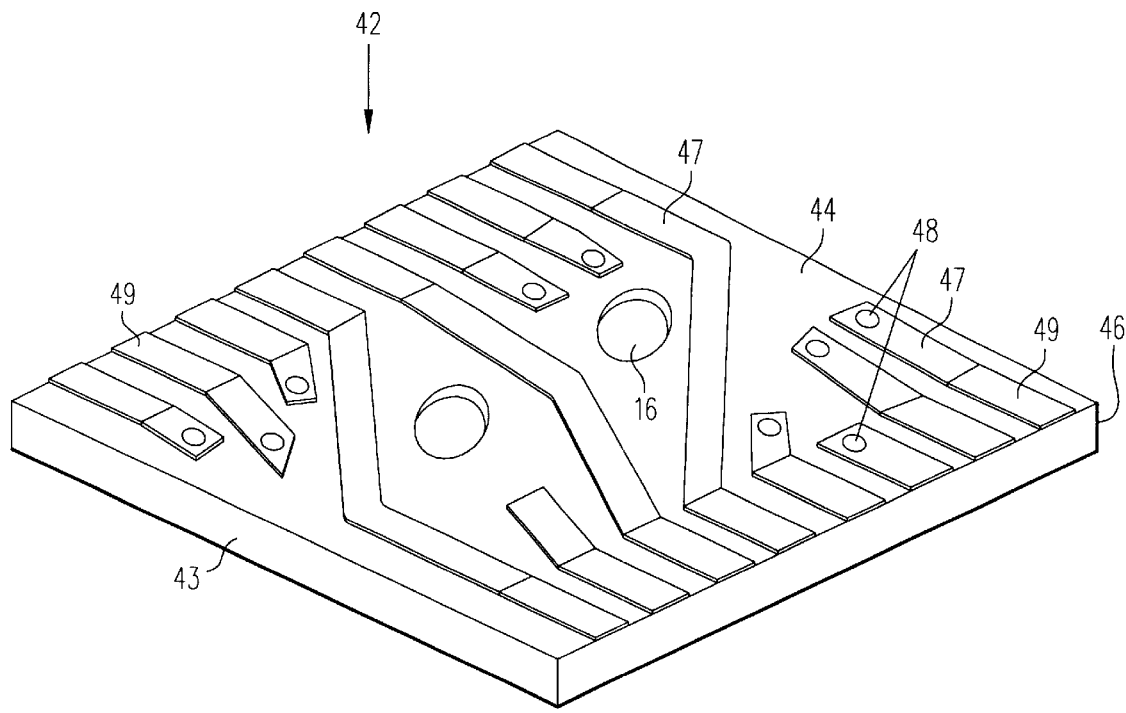
FIG. 4 is a perspective view of interposer 42.
Figure 5:
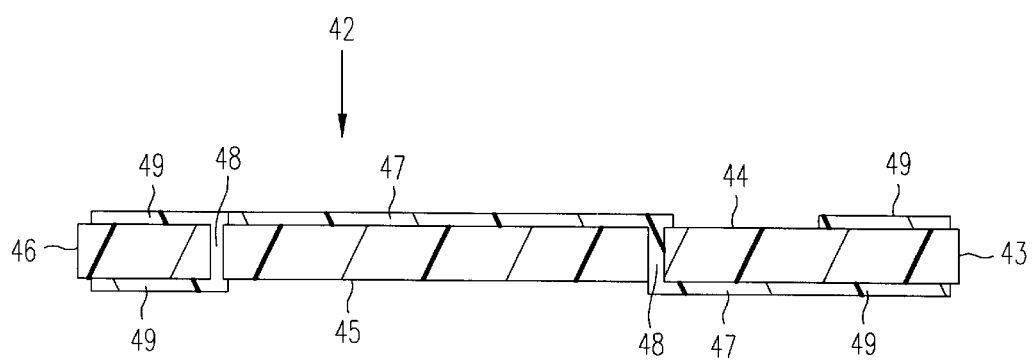
FIG. 5 is a cross-sectional view of interposer 42.

FIGS. 4 and 5 show perspective and cross-sectional side views, respectively, of interposer 42. Interposer 42 includes a first surface 44, an opposite second surface 45, and side surfaces 46 between first surface 44 and second surface 45. In this embodiment, interposer 42 includes a thin insulative layer 43, two opposing metallization layers, and metallized vias 48 that electrically connect particular opposing metallizations through insulative layer 43. Insulative layer 43 may be comprised of a variety of conventional materials, such as polyimide film, mylar, or an epoxy laminate. The metallization layers may be formed of copper or copper alloy, and may be plated with conventional plating metals such as gold, nickel, palladium, and combinations thereof. The pattern of metallizations on interposer 42 will depend on the packages being electrically interconnected through interposer 42, and accordingly, will vary with the application.

Interposer 42 includes two holes 50 that extend through insulative layer 43. The shape and location of holes 50 correspond to keys 15 and keyholes 16 of packages 10 and 41. Keys 15 of lower package 10 of FIG. 4 extend through holes 50 and engage keyholes 16 of package 41.

Referring to FIGS. 3, 4, and 5, rectangular metal contacts 49 are located along two opposing edges of both first surface 44 and second surface 45 of interposer 42. The arrangement of contacts 49 corresponds to the lead configuration of packages 10 and 41. Some contacts 49 of first surface 44 and second surface 45 are electrically connected to metal traces 47. Some of those metal traces 47 are electrically connected to metallized vias 48 that extend through insulative layer 43. Those vias 48, in turn, are electrically connected by metal traces 47 on the opposite surface 44 or 45 of insulative layer 43 to contacts 49. Other contacts 49 on first surface 44 are directly electrically connected by a via 48 to an opposing contact 49 on second surface 45.

Accordingly, interposer 42 provides electrically conductive paths between contacts 49 on first surface 44 and contacts 49 on second surface 45 of interposer 42. These electrically conductive paths allow electrical interconnection of the leads of packages 10 and 41. Other optional metal traces 47 of first surface 44 and second surface 45 are electrically connected between contacts 49 on the same surface 44 or 45 of interposer 42. This allows some leads 21 of package 10 or 41 to be electrically connected to other leads 21 of the same package, which may be useful in some applications.

Referring to stack 40 of FIG. 3, contacts 49 on second surface 45 of interposer 42 abut second surface 26 of first portion 22 of leads 21 of lower package 10. Contacts 49 on first surface 44 of interposer 42 abut second surface 26 of third portion 24 of leads 21 of upper package 41. Solder may be applied between contacts 49 and the abutting portions of leads 21 to ensure an electrical connection between interposer 42 and packages 10 and 41. Accordingly, leads 21 of lower package 10 are electrically interconnected to leads 21 of upper package 41 through interposer 42.

Stack 40 may be constructed by placing a package 10 on printed circuit board 31, and soldering the exposed second surface 26 of third portion 24 of the leads 21 of the package 10 to metal traces 33. Interposer 42 may be placed on first surface 12 of package body 11 of package 10 so that keys 15 of package 10 go through holes 50 and contacts 49 on second surface 45 of interposer 42 abut respective first portions 22 of leads 21 of package 10. Package 41 is placed on first surface 44 of interposer 41 so that: (1) keys 15 of package 10 go into keyholes 16 of package 41; and (2) contacts 49 on first surface 44 abut second surface 26 of third portion 24 of leads 21 of package 41. An electrical interconnection between contacts 49 and leads 21 may be performed by preapplying solder to leads 21 and/or contacts 49 and applying heat either in one step after stack 40 is assembled, or in two steps (one step after interposer 42 is placed on package 10, and one step after package 41 is placed on interposer 42). Other conventional soldering methods also may be used.

As described above, the exterior configuration of packages 10 and 41 allow them to be easily stacked and electrically interconnected. Additional packages may be stacked, with or without interposers 42, on upper package 41 of FIG. 3. For example, an additional package 41 can stacked on package 41 of stack 40. As another example, an additional package 10 may be soldered to printed circuit board 31 adjacent to stack 40 so that some of the vertical second portions 23 of the leads 21 of the two packages 10 abut.

The packaging and interconnection embodiments taught herein can be used to increase the density of packages on a printed circuit board without unduly increasing the mounting area consumed by the packages. The interposer of the present invention allows the electrical interconnection of leads of one package that are not symmetrical with leads of a package stacked thereon.

The embodiments described herein are merely examples of the present invention. Artisans will appreciate that variations are possible within the scope of the claims.

What is claimed is:

1. A plurality of electrically interconnected integrated circuit packages comprising:

at least first and second integrated circuit packages, each comprising a package body formed of an encapsulant material, said package body having a first surface, an opposite second surface, and side surfaces between said first and second surfaces, and a plurality of leads, each said lead having a first portion embedded at the second surface of the package body, a second portion extending vertically adjacent to a side surface of the package body, and a third portion extending over the first surface of the package body; and a member comprising an insulative layer, said insulative layer having a first surface, an opposite second surface, and one or more electrically conductive paths each extending through said insulative layer between said first surface and said second surface, said member positioned between leads of the first and second packages; and wherein one or more leads of the first package are electrically connected to one or more leads of the second package by an electrically conductive path of the member.

2. The packages of claim 1, wherein the member includes a first surface, an opposite second surface, and at least one hole between said first and second surfaces, and a protrusion of at least one of said first and second packages extends through said hole and contacts the other of the first and second packages.

3. The packages of claim 2, wherein said protrusion engages a hole in the package body of the other of the first and second packages.

4. The packages of claim 1, wherein said one or more electrically conductive paths comprise:

a first metallization on a first surface of the member, said first metallization electrically connected to a lead of the first package;

a second metallization on an opposite second surface of the member, said second metallization electrically connected to a lead of the second package; and a metallized via extending through the member and electrically connected between said first and second metallizations.

5. The packages of claim 1, wherein the first portion of the leads includes a first surface exposed at the second surface of the package body, and said electrically conductive path is electrically connected to the first surface of the one or more leads of the second package.

6. The packages of claim 5, wherein the third portion of the one or more leads of the first package is electrically connected to the electrically conductive path.

7. The packages of claim 6, wherein the second package is stacked on the first package.

8. The packages of claim 1, wherein the second package is stacked on the first package.

9. The packages of claim 8, wherein the first package is mounted on a printed circuit board.

10. The packages of claim 1, further comprising one or more second electrically conductive paths on the first or second surfaces of the member, wherein said one or more second electrically conductive paths are electrically connected between leads of either the first or second package.

11. An assembly comprising:

first and second packages, each said package comprising a plurality of metal leads embedded in a body of a molded encapsulant material and an integrated circuit chip within the body and electrically connected to the leads, wherein said body includes a first surface and an opposite second surface, and each lead includes a first portion adjacent to the first surface and a second portion adjacent to the second surface; and an interposer having opposed first and second surfaces and a plurality of electrically conductive paths on the first and second surfaces, wherein at least some of the electrically conductive paths on the first surface are electrically connected to respective ones of the electrically conductive paths on the second surface through the interposer, wherein the first and second packages are stacked with the interposer disposed between them, and wherein at least some of the leads of the first package and at least some of the leads of the second package face and are electrically connected to respective ones of the electrically conductive paths of the first and second surfaces of the interposer, respectively, whereby selected ones of the leads of the first and second packages are electrically interconnected through the interposer.

12. The assembly of claim 11, wherein the interposer includes a hole between the opposed first and second surfaces of the interposer, and a molded portion of the body of the first package is engaged with a molded portion of the body of the second package through the hole.

13. The assembly of claim 12, wherein one of the first and second packages is mounted on and electrically connected to a substrate.

14. The assembly of claim 11, wherein the body of the first package comprises a protrusion, and the body of the second package comprises a recess, and the protrusion extends into the recess.

15. The assembly of claim 11, wherein one of the first and second packages is mounted on and electrically connected to a substrate.

16. The assembly of claim 11, wherein the first portion of the leads of the first and second packages is embedded at the first surface of the respective package and includes an exposed horizontal surface.

17. The assembly of claim 16, wherein the exposed horizontal surface of the first portion of the at least some of the leads of the first package face and are electrically connected to the respective electrically conductive paths of the first surface of the interposer, and the second portion of the at least some of the leads of the second package face and are electrically connected to the respective electrically conductive paths of the second surface of the interposer.

18. The assembly of claim 11, further comprising a means for ensuring the first package can only be stacked with the second package in one orientation.

19. The assembly of claim 11, wherein the integrated circuit chip of the first package is a different type than the integrated circuit chip of the second package.

20. The assembly of claim 11, wherein at least some of the leads of the first package that are electrically connected to respective ones of the leads of the second package through the interposer are distally located from the respective lead of the second package electrically connected thereto.

21. A stack of electrically interconnected packages comprising:

first and second packages stacked one with the other, each said package comprising a package body having opposed first and second surfaces, a plurality of metal leads connected to said package body, and an integrated circuit chip within the package body and electrically connected to the leads, wherein each lead includes a first portion adjacent to the first surface and a second portion adjacent to the second surface; and a first means for electrically connecting at least some leads of the first package with distally-located ones of the leads of the second package, said means being disposed between the first and second packages.

22. The stack of claim 21, wherein a portion of the package body of the first package is engaged with a portion of the package body of the second package through the first means.

23. The stack of claim 21, wherein the first portion of the leads of the first package face and are electrically connected to the first means, and the second portion of the leads of the second package face and are electrically connected to the first means.

24. The stack of claim 21, wherein the package body of the first and second packages is formed of a molded encapsulant material.

25. The stack of claim 21, further comprising a second means for ensuring the first package can only be stacked with the second package in one orientation.

26. The assembly of claim 21, wherein the integrated circuit chip of the first package is a different type than the integrated circuit chip of the second package.

27. An assembly comprising:

first and second packages stacked one with the other, each said package comprising a package body having opposed first and second surfaces, a plurality of metal leads connected to said body, and an integrated circuit chip within the body and electrically connected to the leads, wherein each lead includes a first portion adjacent to the first surface and a second portion adjacent to the second surface; and an interposer comprising an insulative layer with opposed first and second surfaces and a plurality of electrically conductive paths on the first and second surfaces, wherein at least some of the electrically conductive paths on the first surface are electrically connected to respective ones of the electrically conductive paths on the second surface through the interposer, wherein the first portion of at least some of the leads of the first package and the second portion of at least some of the leads of the second package face and are electrically connected to respective ones of the electrically conductive paths of the first and second surfaces of the interposer, respectively, whereby selected ones of the leads of the first and second packages are electrically interconnected through the interposer, and wherein a portion of the body of the first package is engaged with a portion of the body of the second package through the interposer.

28. The assembly of claim 27, wherein one of the first and second packages is mounted on and electrically connected to a substrate.

29. The stack of claim 27, further comprising a second means for ensuring the first package can only be stacked with the second package in one orientation.

30. The assembly of claim 27, wherein the integrated circuit chip of the first package is a different type than the integrated circuit chip of the second package.

* * * * *